United States Patent
Unger et al.

(10) Patent No.: US 7,183,131 B2
(45) Date of Patent: Feb. 27, 2007

(54) PROCESS FOR PRODUCING A NANOELEMENT ARRANGEMENT, AND NANOELEMENT ARRANGEMENT

(75) Inventors: Eugen Unger, Augsburg (DE); Georg Stefan Dusberg, Munich (DE); Andrew Graham, Munich (DE); Maik Liebau, Munich (DE)

(73) Assignee: Infineon Technologies AG (DE)

( * ) Notice: Subject to any disclaimer, the term of this patent is extended or adjusted under 35 U.S.C. 154(b) by 0 days.

(21) Appl. No.: 10/712,767

(22) Filed: Nov. 12, 2003

(65) Prior Publication Data

US 2005/0040847 A1 Feb. 24, 2005

(30) Foreign Application Priority Data

Nov. 12, 2002 (DE) ................ 102 52 607

(51) Int. Cl.
*H01L 51/40* (2006.01)
(52) U.S. Cl. ............ 438/99; 438/500; 438/800; 438/903; 257/40; 257/798; 257/E51.04
(58) Field of Classification Search .......... 438/99, 438/500, 800, 903; 977/DIG. 1; 257/40, 257/798
See application file for complete search history.

(56) References Cited

U.S. PATENT DOCUMENTS 6,871,528 B2 * 3/2005 Schlaf et al. .............. 73/105
2002/0163079 A1 * 11/2002 Awano .................. 257/750

OTHER PUBLICATIONS

Harris, Peter; "Carbon Nanotubes and Related Structures—New Materials for the Twenty-first Century": Cambridge University Press, (1999), pp. 1-15, 111-155.

Li, J. et al; "Nanoelectronics: Growing Y-junction carbon nanotubes"; Nature 402, pp. 253-254 (1999).

Cheung, C. et al; "Diameter-Controlled Synthesis of Carbon Nanotubes"; J. Phys. Chem. B. (2002), 106, pp. 2429-2433.

Murray, C.B. et al; "Monodisperse 3d Transition-Metal (Co, Ni, Fe) Nanoparticles and Their Assembly into Nanoparticle Superlattices"; MRS Bulletin, Dec. 2001, pp. 985-991.

Cao, A. et al; "Carbon nanotube dendrites: Availability and their growth model"; Materials Research Bulletin, 36, (2001), pp. 2519-2523.

Sun, L.F. et al; "Growth of Carbon nanofibers array under magnetic force by chemical vapor deposition"; Chemical Physics Letters 336, (2001), pp. 392-396.

Zhu, Hongwei et al; "Growth mechanism of Y-junction carbon nanotubes"; Diamond and Related Materials 11, (2002), pp. 1349-1352.

Gan, B. et al; "Y-junction carbon nanotubes grown by in situ evaporated copper catalyst"; Chemical Physics Letters 333 (2001), pp. 23-28.

* cited by examiner

*Primary Examiner*—Zandra V. Smith
*Assistant Examiner*—Christy Novacek
(74) *Attorney, Agent, or Firm*—Dickstein, Shapiro, LLP.

(57) ABSTRACT

A process for producing a nanoelement arrangement and to a nanoelement arrangement. A first nanoelement is at least partially covered with catalyst material for catalyzing the growth of nanoelements. Furthermore, at least one second nanoelement is grown on the catalyst material.

Also, a nanoelement arrangement having a first nanoelement on which at least one predetermined region is covered with catalyst material for catalyzing the growth of nanoelements, and at least one second nanoelement grown on the catalyst material.

19 Claims, 4 Drawing Sheets

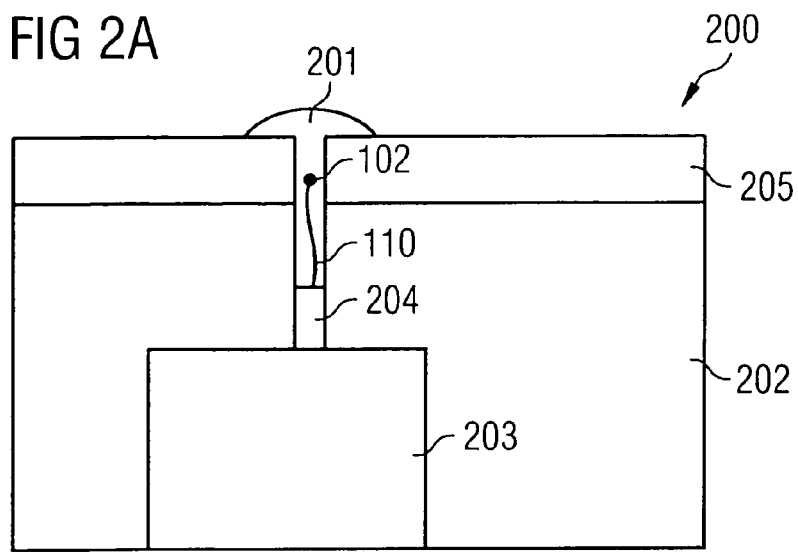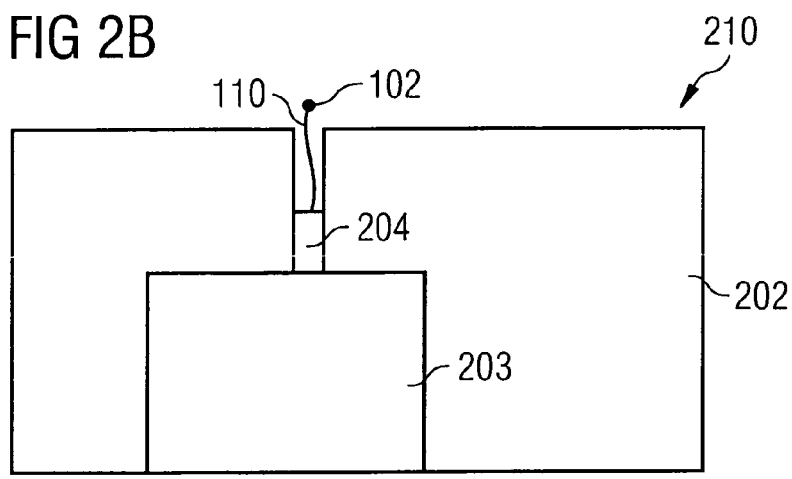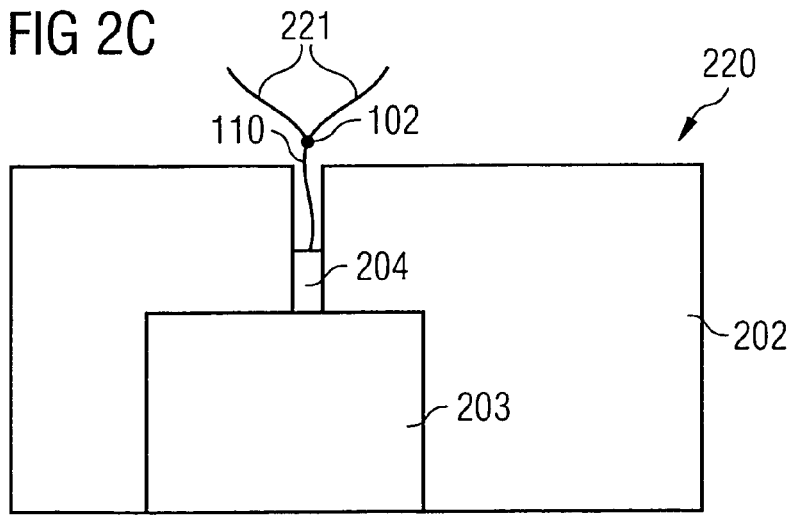

PROCESS FOR PRODUCING A NANOELEMENT ARRANGEMENT, AND NANOELEMENT ARRANGEMENT

CROSS-REFERENCE TO RELATED APPLICATION

This application is based on German Application No. 102 52 607.9, which was filed on Nov. 12, 2002.

FIELD OF THE INVENTION

The invention relates to a process for producing a nanoelement arrangement and to a nanoelement arrangement.

BACKGROUND OF THE INVENTION

With ongoing miniaturization, conventional silicon microelectronics will reach its limit. Disruptive short-channel effects are becoming an ever more important factor with ongoing miniaturization in a field-effect transistor, restricting the conductivity of the field-effect transistor. In addition to the problems which arise in an individual component, a further difficulty in a memory arrangement is a limited scaleability of the storage medium, for example the capacitance in a DRAM (dynamic random access memory) cannot be scaled to any desired degree.

The use of carbon nanotubes is under discussion as a possible successor technology to silicon microelectronics. Basic principles of carbon nanotubes are described, for example, in Harris, P J F (1999) "Carbon Nanotubes and Related Structures—New Materials for the Twenty-first Century", Cambridge University Press, Cambridge, pp. 1 to 15, 111 to 155. It is known that carbon nanotubes (depending on the tube parameters) have an electrical conductivity ranging from semiconducting to metallic.

On account of their electrical properties, carbon nanotubes are being studied not only as a possible alternative to conventional active elements, such as field-effect transistors, diodes, etc., but also, on account of their high current-carrying capacity and small dimensions in the range of nanometer, as a replacement for conventional metallization material (aluminium, copper, etc.). Since the coupling of electrical switching elements in a circuit requires the production not only of simple point-to-point interconnects but also of branched electrical lines, there is a need for it to be possible to branch current paths using carbon nanotubes.

It is known from Li, J. Papadopoulos, C Xu, J (1999) "Nanoelectronics: Growing Y-junction carbon nanotubes", Nature 402:253–254 to produce a Y-shaped junction of carbon nanotubes by forming a spot of catalyst material in an end section of a Y-shaped channel in an aluminium oxide template ($Al_2O_3$). Then, in accordance with Li et al., a carbon nanotube with a Y-shaped junction is formed in the channel starting from the spot of catalyst material by means of pyrolysis of acetylene.

However, the process which is known from Li et al. is restricted to the formation of branched carbon nanotubes inside a template.

At some locations, branched carbon nanotubes may randomly result during the synthesis of carbon nanotubes, for example using a CVD process (chemical vapour deposition). However, this process cannot be used to control the spatially defined formation of branched carbon nanotubes.

It is known from Cheung, C L, Kurtz, A, Park, H, Lieber, C M (2002) "Diameter-Controlled Synthesis of Carbon Nanotubes", JPhysChemB 106:2429–2433 to deposit iron clusters of predeterminable size on a substrate and to grow on carbon nanotubes using a CVD process starting from the iron clusters which have a catalytic action for the growth of carbon nanotubes. The diameter of the carbon nanotubes can be set by predetermining the diameter of the clusters.

Murray, C B, Sun, S, Doyle, H, Betley, T "Monodispersive 3d Transition-Metal (Co, Ni, Fe) Nanoparticles and Their Assembly into Nanoparticle Superlattices", MRS Bulletin, December 2001, discloses a process by which metal clusters can be produced from 3d transition metals.

Cao, A, Zhang, X, Xu, C, Liang, J, Wu, D, Wei, B (2000) "Carbon nanotube dendrites: Availability and their growth model", Materials Research Bulletin 36:2519–2523, discloses a growth model for dendrites of carbon nanotubes.

Sun, L F, Liu, Z Q, Ma, V C, Tang, D S, Zhou, W Y, Zou, X P, Li, Y B, Lin, J Y, Tan, K L, Xie, S S (2001) "Growth of nanofibers array under magnetic force by chemical vapor deposition", Chemical Physics Letters 336:392–396, discloses the growth of carbon nanofibres under magnetic force by means of a CVD process.

Zhu, H, Ci, L, Xu, C, Liang, J, Wu, D (2002) "Growth mechanism of Y-junction carbon nanotubes", Diamond and Related Materials 11:1349–1352, discloses a growth mechanism of Y-junction carbon nanotubes.

Gan, B, Ahn, J, Zhang, Q, Rusli, Yoon, S F, Yu, J, Huang, Q F, Chew, K, Ligatchev, V A, Zhang, X B, Li, W Z (2001) "Y-junction carbon nanotubes grown by in situ evaporated copper catalyst", Chemical Physics Letters 333:23–28, discloses Y-junction carbon nanotubes grown by means of an evaporated copper catalyst.

SUMMARY OF THE INVENTION

The invention is based on the problem of providing a different process for producing a nanoelement arrangement and a different nanoelement arrangement in which it is possible to predetermine whether nanoelements are branched.

The problem is solved by a process for producing a nanoelement arrangement, and by a nanoelement arrangement having the features described in the independent patent claims.

A first nanoelement, which has already been fully produced, is at least partially covered with catalyst material for catalyzing the growth of nanoelements in the process for producing a nanoelement arrangement. Then, at least one second nanoelement is grown on the catalyst material.

The nanoelement arrangement of the invention includes a first nanoelement, which is at least partially covered with catalyst material for catalyzing the growth of nanoelements. Furthermore, the nanoelement arrangement includes at least one second nanoelement which has grown on the catalyst material.

A basic idea of the invention is for one location or a plurality of locations on the first nanoelement, on which at least one second nanoelement can preferentially be grown, is or are predeterminable by covering partial regions, which can be predetermined in a defined manner, of a first nanoelement which has already been fully produced. These locations can be predetermined by the catalyst material being deposited in targeted fashion on desired regions of the first nanoelement. Since the catalyst material has a catalytic action for the growth of nanoelements, in a subsequent process step for forming second nanoelements, the second nanoelements grow preferentially on the catalyst regions on the first nanoelement. Since it is technologically feasible to produce clusters from 3d transition metals with a targeted dimension in the nanometre range, and since numerous 3d transition metals (e.g., iron, cobalt, nickel), for example, catalytically promote the formation of carbon nanotubes, highly accurate definition of growth locations for second nanoelements on the surface of a first nanoelement is possible.

According to the invention, there is no need for a substrate to produce branched networks of nanoelements.

Furthermore, complex multiple branching of nanoelements according to the requirements of a particular application, e.g., of an integrated circuit with branched interconnects, are possible.

The invention is based on the experimental discovery that catalyst material, for example in the form of metallic clusters, bonds particularly well to nanoelements, such as for example carbon nanotubes, creating a reliable way of predetermining the locations of the subsequent growth of a second nanoelement and of ensuring permanent bonding of the catalyst material. By way of example, a cobalt cluster may be surrounded by a monolayer of an organic material, which monolayer has a good bonding action with carbon nanotubes.

Since catalyst material for the growth of nanoelements in many cases has a good electrical conductivity (for example 3d transition metals, such as iron, cobalt or nickel), an electrically conductive coupling location between the nanotubes is possible. It is therefore possible to produce a continuous conductive connection between the, for example, electrically conductive nanoelements and the catalyst material as coupling means.

Preferred developments of the invention will emerge from the dependent claims.

The catalyst material can be applied to the first nanoelement in the form of at least one cluster. Clusters of 3d transition metals of this type can be produced using the processes described in Cheung et al. or Murray et al. By setting the size of the metallic clusters, it is possible to ensure whether one or more second nanoelements can be grown on the respective cluster and what diameter and therefore what electrical properties the second nanoelement to be grown is to have. Furthermore, clusters of this type may be surrounded, for example, by a thin film of organic material, for example surfactants, thereby facilitating the coupling of the clusters to the first and second nanoelements.

The catalyst material may be applied to the first nanoelement by the first nanoelement being brought into operative contact, in a suspension, with clusters of catalyst material, and then the first nanoelement with at least one cluster attached to it being removed from the suspension. If finished first nanoelements are introduced into a suspension of clusters, the clusters bond to the surface of the nanoelements as it were of their own accord. This results in a simplified process for forming clusters on the surface of the first nanoelements.

The first nanoelement with the at least one cluster attached (or chemically or physically bonded) to it, can be resuspended and applied to a substrate. In other words, the first nanoelement, to which one or more clusters is/are attached, can be resuspended in a suitable solution/suspension, and can be applied to any desired substrate, for example using a pipette/micropipette or by spraying.

The first nanoelement with the at least one cluster attached to it can be subjected to a process step for forming the at least one second nanoelement, in such a manner that the at least one second nanoelement is grown on the at least one cluster. On account of their catalyst function, the clusters evidently form a nucleation location for the growth of a second nanoelement, with the result that a second nanoelement grows on the first nanoelement.

A CVD (chemical vapour deposition) process is preferably used to form the at least one second nanoelement on the catalyst material cluster of the first nanoelement. By way of example, for this purpose acetylene can be introduced into a CVD process chamber, with the result that the formation of the second nanoelement is set in motion. This nanoelement is preferentially grown on the first nanoelement on account of the catalytic action for the growth of nanoelements.

The catalyst material between the first and the at least one second nanoelement can then be nickel-plated, i.e., provided with nickel material at least at the surface. To improve an electrical contact resistance at the branching location between a first and a second nanoelement, it is possible, for example when iron material is used as catalyst material, to carry out a wet-chemical, electroless nickel-plating at the branching point, which is catalyzed by the existing iron material, in order to improve the electrical properties of the branching point.

A partial region of the first nanoelement can be covered with a protective layer, which preferably has no catalytic action for the growth of nanoelements. In other words, the material of the protective layer is preferably selected in such a way that nanoelements cannot grow or can only grow to a slight extent on the protective layer. In such a case, significant growth of nanoelements is only possible where the first nanoelement does not have the protective layer. Surface regions of the nanoelement, to which catalyst material clusters can be applied, can be uncovered in a defined manner by covering a partial region of the first nanoelement with a protective layer of this type, for example using a lithography process and an etching process. If the protective layer is then removed, catalyst material spots remain only at the predetermined surface regions of the first nanoelement. As a result, second nanoelements are grown only on surface regions which were previously not covered by the protective layer and which are covered by catalyst material spots. This allows particularly good spatial definition of those regions on the first nanoelement on which a second nanoelement can be grown. It is also possible for the protective layer only to be removed after the at least one second nanoelement has been grown on.

The protective layer used may, for example, be resist, for example a photoresist, a surfactant, another organic material, an oxidized material or a metal which has no catalytic action for the growth of nanoelements, for example gold material.

The catalyst material used may, for example, be iron, cobalt or nickel, a combination of the said metals or other 3d transition metals. It is possible to use an alloy of iron and/or cobalt and/or nickel with aluminium, titanium, molybdenum and/or platinum. The said materials can advantageously be used as catalyst material, in particular if the nanoelement used is a carbon nanotube.

The following text describes the nanoelement arrangement according to the invention in more detail. Refinements of the process for producing the nanoelement arrangement also apply to the nanoelement arrangement, and vice-versa.

With the nanoelement arrangement according to the invention, it is possible for only part of the first nanoelement to be covered with catalyst material for catalyzing the growth of nanoelements. As a result of another partial region of the first nanoelement being free of catalyst material of this nature, it is possible to predetermine in a targeted manner those locations on which a second nanoelement can be grown.

The first nanoelement can be grown in a pore introduced in a substrate. In this way it is possible, for example, for the first nanoelement to be formed as a vertical nanoelement which extends along a preferably vertical pore introduced in a substrate. If the first nanoelement projects out of the pore and a spot of catalyst material is formed at the projecting region of the nanoelement, it is possible for a second nanoelement to be grown on the first nanoelement.

The first nanoelement may be grown in the pore on a metallization plane in the substrate. In this way, it is possible for the first nanoelement to already be electrically coupled to a metallization plane, and in this case the metallization plane can in turn be coupled to an integrated circuit in the substrate or may form part of this circuit. Since the first nanoelement and/or the second nanoelement is preferably electrically conductive or semiconducting, it is possible to create a continuous, electrically conductive connection between the integrated circuit and the first or second nanoelement. This is advantageous with a view to forming an integrated circuit with a dimension in the nanometre range.

The first and/or the at least one second nanoelement and/or at least one additional nanoelement may be grown on top of one another and/or next to one another. In this way, it is possible to produce an areal or three-dimensional arrangement of nanoelements, so that it is clearly possible to form a network of interconnects which is suitable for numerous applications (for example memory cell circuits or logic circuits).

The first and/or the at least one second nanoelement may include a nanotube, a bundle of nanotubes or a nanorod. The nanorod may, for example, include silicon, germanium, indium phosphide, gallium nitride, gallium arsenide, zirconium oxide and/or a metal. The nanotube may, for example, be a carbon nanotube, a carbon-boron nanotube, a carbon-nitrogen nanotube, a tungsten sulphide nanotube or a chalcogenide nanotube.

The first and/or the at least one second nanoelement may, for example, be a carbon nanotube. In this case, iron, cobalt and/or nickel are preferred for use as catalyst material. It is also possible to use an alloy of iron and/or cobalt and/or nickel with aluminium, titanium, molybdenum and/or platinum.

The nanoelement arrangement of the invention may include an integrated circuit which is coupled to the first and/or the at least one second nanoelement. Therefore, the nanoelements may be connected to an integrated circuit, for example in order to couple the integrated circuit to miniaturized components.

Furthermore, in the nanoelement arrangement the nanoelements may form a multiply branched network. In other words, the nanoelements which are coupled to one another may be branched a plurality or multiplicity of times with any desired complexity, for example in order to form a desired network of electrical lines.

Evidently, according to the invention carbon nanotubes which have already been finally produced can be activated with a catalytically active metal suspension in such a manner that additional nanotubes can be branched from the particles of the metal suspension. In this case, it is possible for carbon nanotubes which have already been formed to be activated either along their entire length or only along a limited section, by the remaining region being covered using a resist, an oxide layer or a catalytically substantially inactive metal.

If vias (i.e., contact holes between different metallization planes in a substrate) are filled with carbon nanotubes, the process according to the invention can be used to increase the filling density of the vias with carbon nanotubes. For this purpose, by way of example, the via can be filled with a first carbon nanotube which is sheathed with a catalyst material, and then second carbon nanotube can be formed on the catalyst material on the first carbon nanotube in order to increase the filling density of the via.

According to the invention, metal clusters of a suitable size and reactivity are bonded to first carbon nanotubes, which have already been formed, and are then subjected to a further synthesis step. This synthesis step can be carried out, for example, in a furnace into which acetylene, ethene or methane is introduced under reduced or atmospheric pressure at 300° C. to 1000° C. A CVD process is suitable for forming the second nanoelements.

The metal clusters which form the catalyst material may, for example, be produced using the processes described in Cheung et al., Murray et al.

By way of example, it is possible to use multi-walled carbon nanotubes as first nanoelements. These can be produced using a CVD process. The carbon nanotubes produced can be used directly or may be oxidized in order to improve the solubility with a suitable chemical (for example sodium hypochlorite NaOCl). The carbon nanotubes can be treated with a suspension of iron clusters in toluene at room temperature. The iron clusters can be produced from iron pentacarbonyl ($Fe(CO)_5$) and oleic acid ((Z)- or cis-9-octadecenoic acid, $C_{18}H_{34}O_2$). The carbon nanotube material which is in suspension can be filtered off and solvent residues can be removed. It can be resuspended using dimethylformamide ($C_3H_7NO$). A drop of this solution can be applied to a substrate, or a solution which has been diluted with isopropanol can be sprayed on. During this process step, part of the substrate can be covered in order for a subsequent lift-off patterning process to be carried out, for example by means of photoresist. In this way, it is possible to ensure that carbon nanotubes are applied only to desired surface regions of a substrate. After the solution has been applied and after a possible subsequent lift-off process for removal of the photoresist, the substrate can be introduced into a reaction furnace after it has been dried. Subsequently, second carbon nanotubes can be synthesized branching off from the first carbon nanotube. Then, in order to improve the electrical contact resistance at a respective branching point, a preferably wet-chemical, electroless nickel plating step can be carried out at the branching point.

It should be noted that according to the invention the catalyst material used may be not only metal clusters from 3d elements, such as iron, cobalt or nickel, which have been produced from the corresponding carbonyls, but also, for example, those clusters which can be produced from salts of organic acids with the aid of diols as reducing agent. Alloys of the abovementioned metals with Al, Ti, Mo, Pd, Pt, Ru, Ph, Os or Ir are also possible.

BRIEF DESCRIPTION OF THE DRAWINGS

Exemplary embodiments of the invention are illustrated in the figures and are explained in more detail in the text which follows. In the drawing:

FIGS. 2A and 2B show cross-sectional views of layer sequences during the process for producing a nanoelement arrangement according to the preferred exemplary embodiment of the invention, FIG. 2C shows a cross-sectional view through a nanoelement arrangement in accordance with the preferred exemplary embodiment of the invention.

Identical or similar components in different figures are provided with identical reference numerals.

The illustrations in the figures are diagrammatic and not to scale.

DETAILED DESCRIPTION OF THE PREFERRED MODE OF THE INVENTION

The text which follows describes, with reference to FIG. 1A, FIG. 1B, FIG. 2A to FIG. 2C, a process for producing a carbon nanotube arrangement in accordance with a preferred exemplary embodiment of the invention.

Figure 1A:
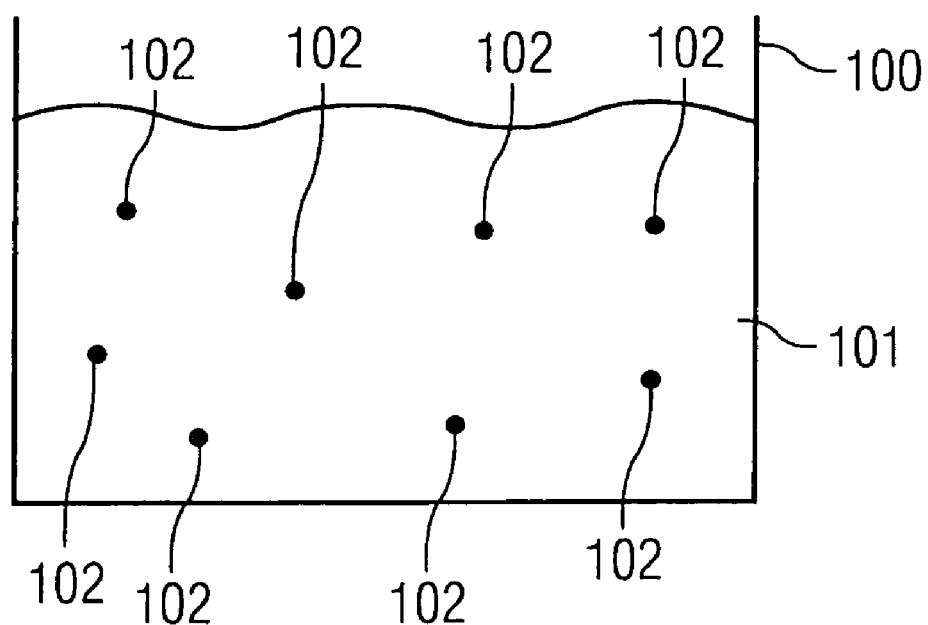
FIGS. 1A and 1B show diagrammatic views of suspensions during a process for producing first carbon nanotubes covered with catalyst material clusters using a process for producing a nanoelement arrangement according to a preferred exemplary embodiment of the invention.

FIG. 1A shows a container 100 which contains a suspension of toluene solvent 101 and iron clusters 102. The iron clusters are surrounded by a thin film of oleic acid (not shown).

Figure 1B:
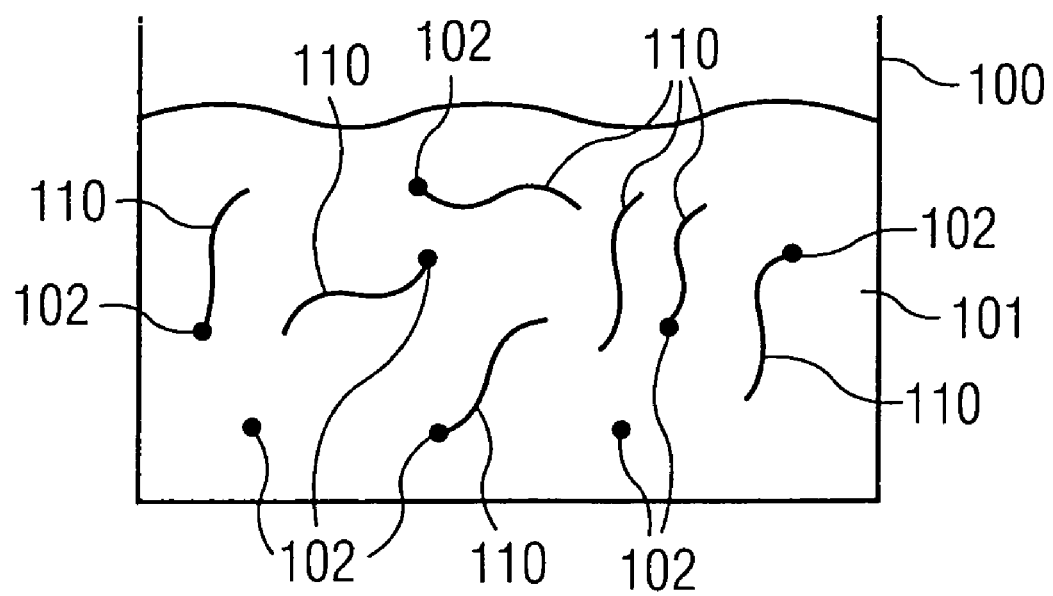

FIG. 1B shows the operating state of the container 100 after carbon nanotubes 110 have been introduced into the suspension using a CVD process. The carbon nanotubes 110 are surrounded along most of their length with a protective layer (not shown) of a photoresist, and the carbon nanotubes 110 are only free of the protective layer in a region surrounding an end section of the carbon nanotubes 110. After the carbon nanotubes 110 partially covered with the protective layer have been introduced into the suspension of toluene 101 and iron clusters 102, iron clusters 102 attach themselves only to those locations of the carbon nanotubes 110 at which the latter are free of the protective layer. The oleic acid sheath by which the iron clusters 102 are surrounded evidently serves as a bonding layer for bonding the iron clusters 102 to the carbon nanotubes 110. This makes it possible for iron clusters 102 to be attached only to spatially defined locations on the carbon nanotubes, as catalyst material spots for catalyzing subsequent formation of second carbon nanotubes.

In a further process step, the complexes of iron clusters 102 and carbon nanotubes 110 are separated from the solvent 101 and resuspended in dimethylformamide 201.

The text which follows describes, with reference to the layer sequences shown in FIG. 2A to 2C, how a carbon nanotube arrangement according to a preferred exemplary embodiment of the invention is produced using the resuspended carbon nanotubes 110 provided with iron clusters 102.

The layer sequence 200 shown in FIG. 2A is formed from a silicon substrate 202, in which an integrated circuit 203 is formed. An electrically conductive coupling means 204 is formed in a contact hole in the silicon substrate 202. A photoresist layer 205 is applied to the surface of the silicon substrate 202 and etched together with the silicon substrate 202 to form the contact hole using a lithography process and an etching process. The photoresist layer 205 is selected from a material which is such that carbon nanotubes do not attach themselves or scarcely attach themselves to this material. A drop of the suspension of dimethylformamide 201 and the carbon nanotube 110 provided with the iron cluster 102 is applied to the contact hole in the layer sequence 200 by means of a micropipette. The carbon nanotube 110 is oriented vertically in the contact hole and is bonded to the electrically conductive coupling means 204 in order to be coupled to the integrated circuit 303.

To obtain the layer sequence 210 shown in FIG. 2B, the dimethylformamide material 201 is removed by drying. Furthermore, the material of the photoresist layer 205 is removed using a suitable etching process. The etching process is a selective etching process which is selected in such a manner that the etching removes the photoresist layer 205 but not the carbon nanotube 110 together with the catalyst material spot 102.

To obtain the carbon nanotube arrangement 220 in accordance with the preferred exemplary embodiment of the invention shown in FIG. 2C, the layer sequence 210 is subjected to a CVD (chemical vapour deposition) process step in a reaction furnace by acetylene material under reduced pressure being introduced into the process chamber at 700° C. As a result, additional carbon nanotubes 221 are formed starting from the iron cluster 102 as catalyst material spot. This results in a spatially defined branching of carbon nanotubes.

Figure 3A:
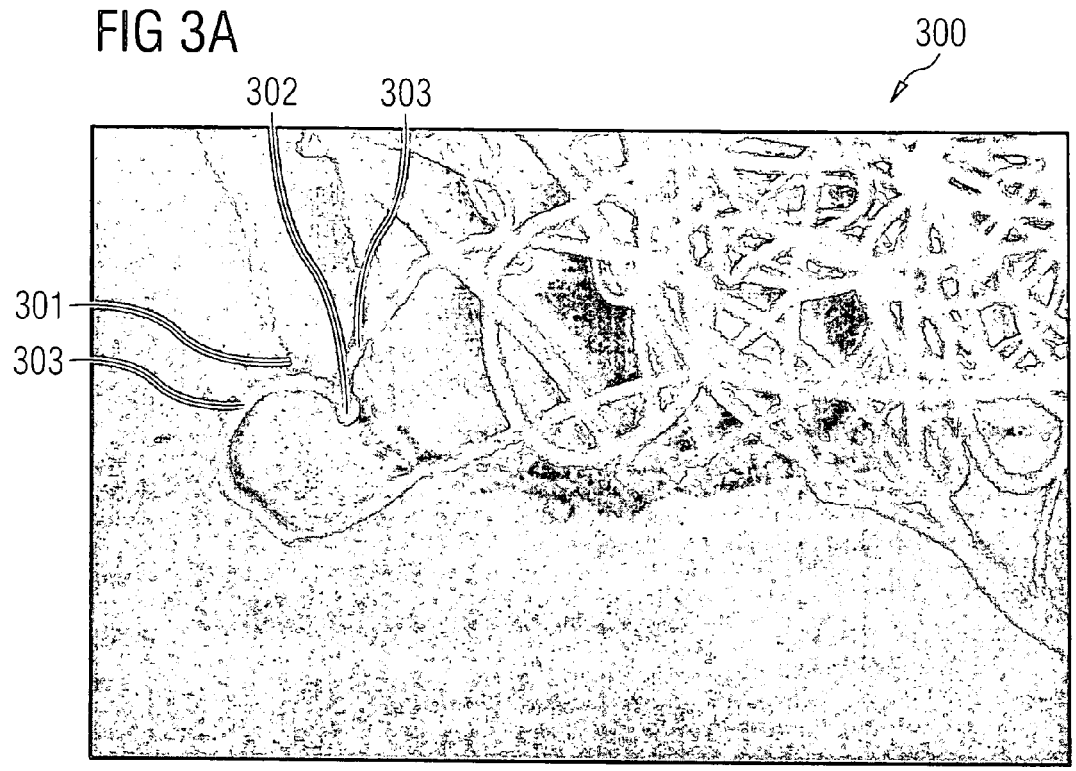
FIGS. 3A to 3C show electron microscope images of nanoelement arrangements in accordance with preferred exemplary embodiments of the invention.
Figure 3B:
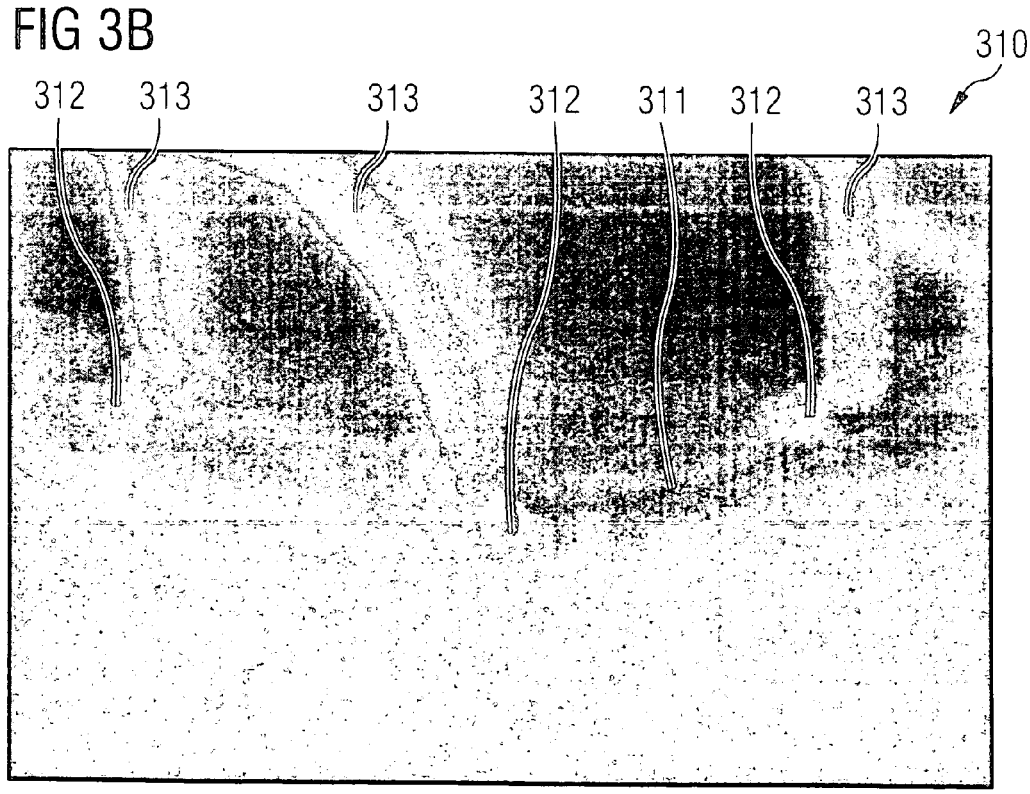
Figure 3C:
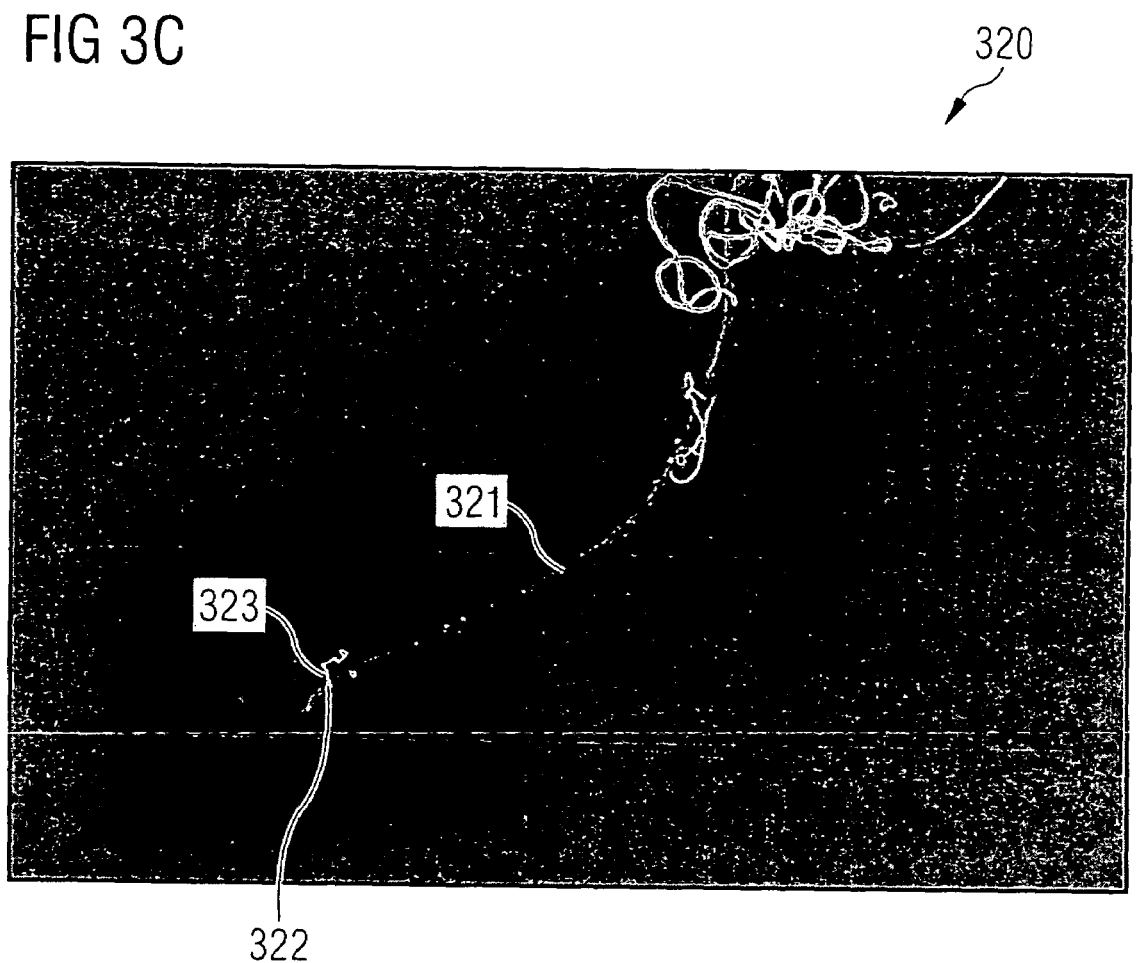

The text which follows describes, with reference to FIG. 3A to FIG. 3C, electron microscope images of carbon nanotube arrangements in accordance with preferred exemplary embodiments of the invention.

The electron microscope image 300 from FIG. 3A shows a primary carbon nanotube 301, on which a catalyst material spot 302 is formed. A branching of secondary carbon nanotubes 303 starting from this catalyst material spot 302 made from iron material can be seen.

FIG. 3B illustrates an electron microscope image 310 with a particularly high magnification factor, showing a primary carbon nanotube 311. Secondary carbon nanotubes 313 are shown starting from catalyst material spots 312 on the primary carbon nanotube 311.

FIG. 3C shows yet another electron microscope image 320, in which a secondary carbon nanotube 323 has been grown starting from a catalyst material spot 322 on a primary carbon nanotube 321.

The invention claimed is:

1. A process for producing a nanoelement arrangement, comprising the steps of:
    forming a first nanoelement;
    covering, with catalyst material in a form of at least one cluster for catalyzing growth of nanoelements, the first nanoelement in at least one predetermined region, wherein the covering step comprises the steps of:
    bringing the first nanoelement into operative contact with a suspension having clusters of catalyst material; and
    removing the first nanoelement with at least one cluster attached thereto from the suspension; and
    growing at least one second nanoelement on the catalyst material.

2. The process according to 1, wherein the first nanoelement with the at least one cluster attached thereto is resuspended and is applied to a substrate.

3. The process according to 1, wherein the growing step includes growing the at least one second nanoelement on the at least one cluster.

4. The process according to 2, wherein the at least one second nanoelement is formed using a chemical vapor deposition process.

5. The process according to 1, wherein the catalyst material between the first and the at least one second nanoelement is nickel-plated.

6. The process according to 1, further comprising the step of covering a partial region of the first nanoelement with a protective layer which has no catalytic action for the growth of nanoelements.

7. The process according to 6, wherein the protective layer used is a resist, surfactant, organic material, oxidized material, or a metal which has no catalytic action for the growth of nanoelements.

8. The process according to 1, wherein the catalyst material comprises at least one of iron, cobalt, nickel, and an alloy of these metals with aluminium, titanium, molybdenum and/or platinum.

9. A nanoelement arrangement comprising:
a first nanoelement on which at least one predetermined region is covered in a targeted fashion with catalyst material deposited after the first nanoelement has been fully produced, the catalyst material being in a form of at least one cluster for catalyzing the growth of nanoelements,
wherein the first nanoelement is covered with the catalyst material by bringing the first nanoelement into operative contact with a suspension having clusters of catalyst material and an ingredient that serves as a bonding layer to thereby improve the bonding between the catalyst material and the first nanoelement, and by removing the first nanoelement with at least one cluster attached thereto from the suspension; and
at least one second nanoelement grown on the catalyst material.

10. The nanoelement arrangement according to 9, wherein only a portion of the first nanoelement is covered with catalyst material for catalyzing the growth of nanoelements.

11. The nanoelement arrangement according to 9, wherein the first nanoelement is grown in a pore introduced in a substrate.

12. The nanoelement arrangement according to 11, wherein the first nanoelement is grown in the pore on a metallization plane in the substrate.

13. The nanoelement arrangement according to 9, wherein the first and/or the at least one second nanoelement and/or at least one additional nanoelement are grown on top of one another and/or next to one another.

14. The nanoelement arrangement according to 9, wherein the first and/or the at least one second nanoelement includes a nanotube, a bundle of nanotubes, or a nanorod.

15. The nanoelement arrangement according to 14, wherein the nanorod comprises at least one of silicon, germanium, indium phosphide, gallium nitride, gallium arsenide, zirconium oxide, and a metal.

16. The nanoelement arrangement according to 14, wherein the nanotube is a carbon nanotube, a carbon-boron nanotube, a carbon-nitrogen nanotube, a tungsten suiphide nanostructure, or a chalcogenide nanotube.

17. The nanoelement arrangement according to 14, wherein the first and/or the at least one second nanoelement is a carbon nanotube, and wherein the catalyst material comprises at least one of iron, cobalt, nickel and, an alloy of these metals with aluminium, titanium, molybdenum, and platinum.

18. The nanoelement arrangement according to 9, further comprising an integrated circuit coupled to the first and/or the at least one second nanoelement.

19. The nanoelement arrangement according to 9, wherein the nanoelements form a branched network.

* * * * *